United States Patent [19]
Sugai et al.

[11] Patent Number: 5,885,365
[45] Date of Patent: Mar. 23, 1999

[54] CLEANING METHOD OF CRUCIBLE

[75] Inventors: Shiniti Sugai; Kouzou Yokota; Tadashi Niwayama; Michiaki Oda, all of Annaka; Shiniti Kon, Nishihirakawa-gun, all of Japan

[73] Assignee: Shin-Etsu Handotai Co., Ltd., Tokyo, Japan

[21] Appl. No.: 820,387

[22] Filed: Mar. 12, 1997

[30]    Foreign Application Priority Data

Mar. 22, 1996  [JP]  Japan .................................... 8-093619

[51] Int. Cl.⁶ ................................ B08B 3/10; B08B 5/00; B08B 9/00
[52] U.S. Cl. ................................ 134/26; 134/19; 134/21; 134/22.1; 134/25.4; 134/37
[58] Field of Search .................................. 134/19, 2, 22.1, 134/30, 26, 21, 37, 25.4

[56]           References Cited

U.S. PATENT DOCUMENTS 4,028,137  6/1977  Ellbrunner et al. ...................... 134/21

*Primary Examiner*—Zeinab El-Arini
*Attorney, Agent, or Firm*—Oliff & Berridge, PLC

[57]           ABSTRACT

A method for cleaning and drying crucibles for use in pulling single crystals by the Czochralski method after transportation of the crucibles, includes cleaning a crucible in a cleaning process; warming the crucible with pure water heated at a temperature of at least 50° C.; and drying the warmed crucible under ambient conditions.

10 Claims, 4 Drawing Sheets

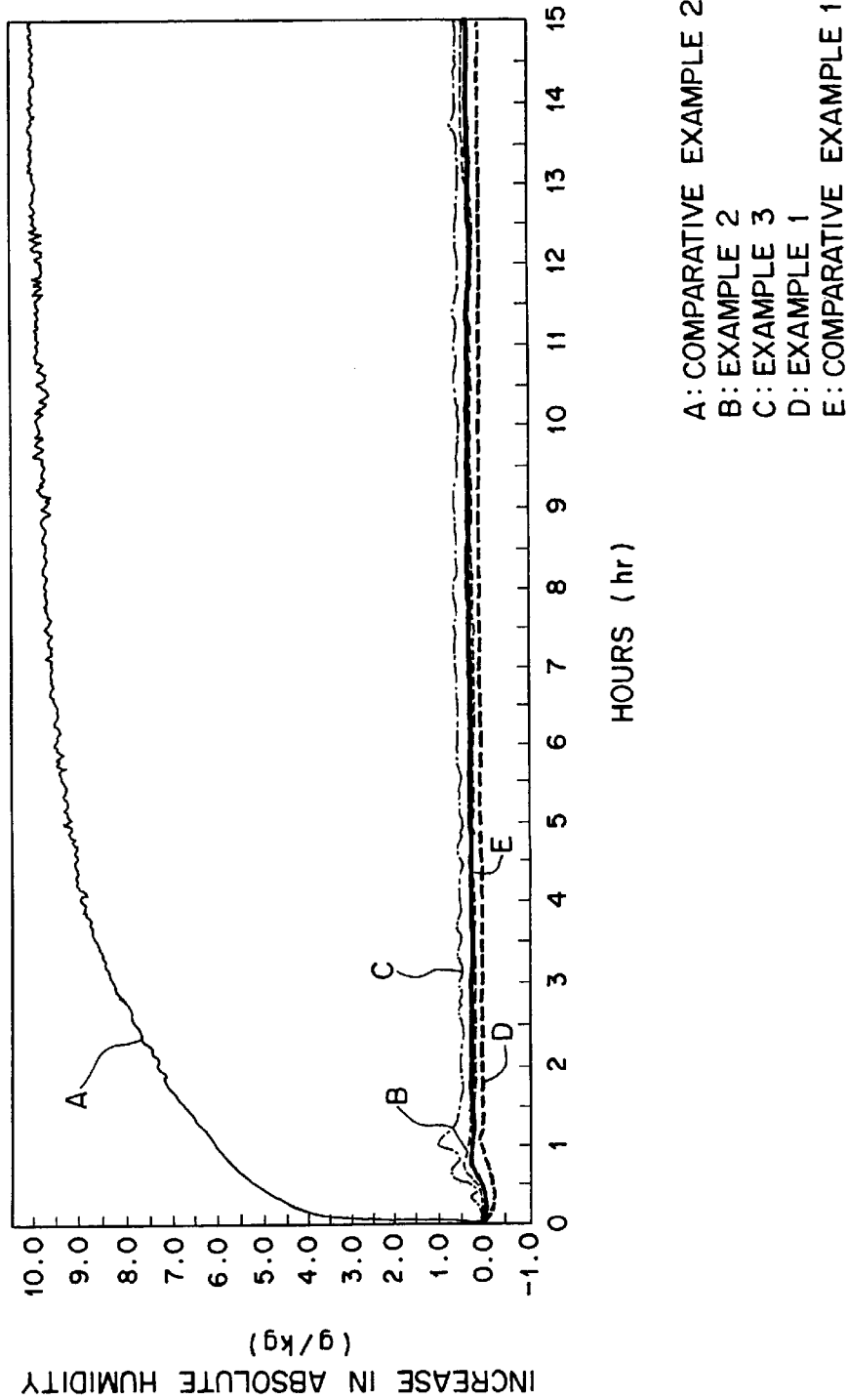

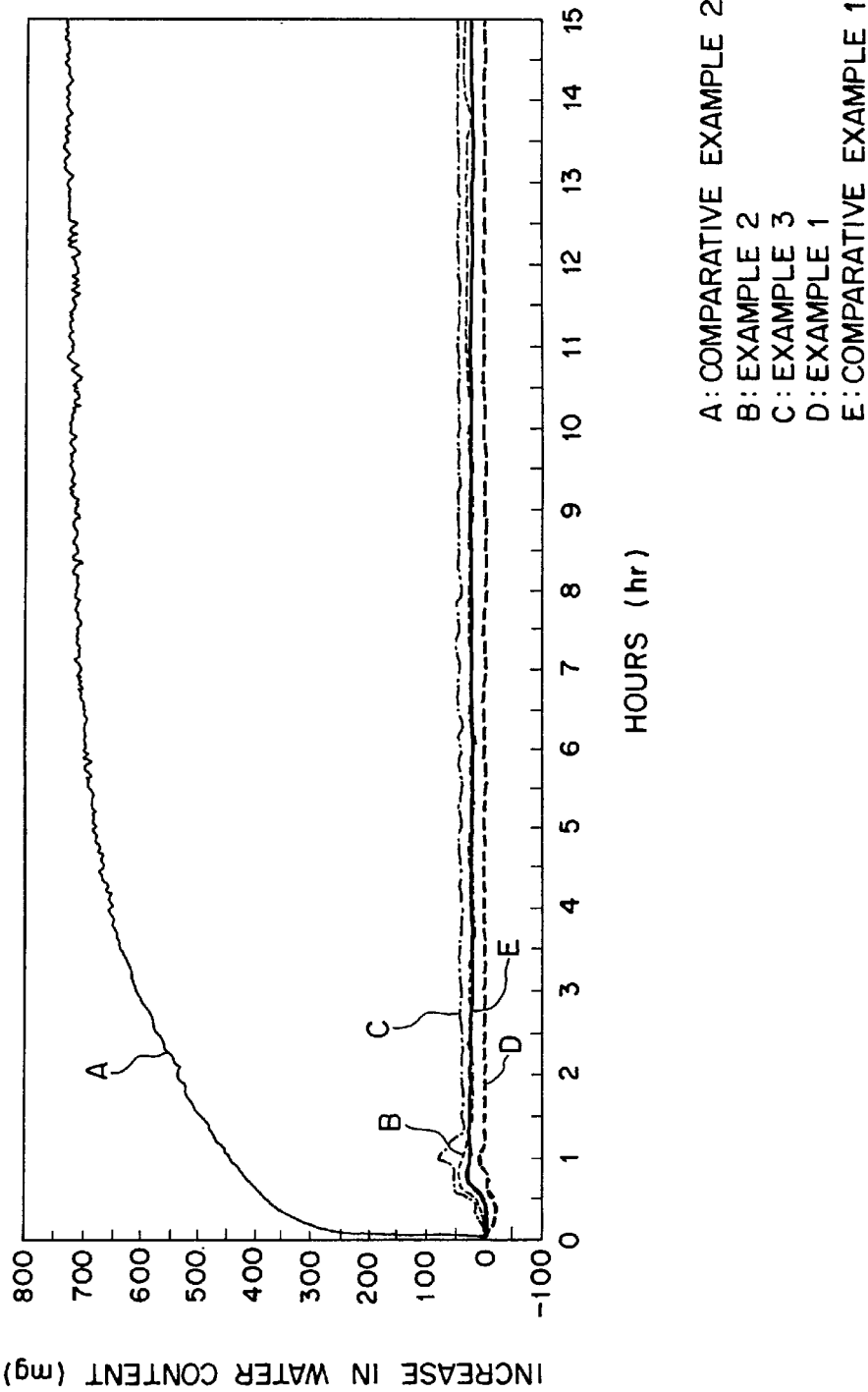

CLEANING METHOD OF CRUCIBLE

BACKGROUND OF THE INVENTION

1. Field of the Invention

The present invention relates to a cleaning method of a crucible which is used to contain a raw material melt in pulling a semiconductor single crystal by a Czochralski method. More particularly the present invention relates to a method for drying a crucible which is conducted in the last step of a cleaning process before the use of the crucible.

2. Related Art

Heretofore, in the case where a semiconductor single crystal is pulled by a Czochralski method, such a process has been adopted that raw material of the crystal is charged into a crucible, the crucible with the raw material is placed in a pulling furnace, the raw material is heated up to a temperature equal to or higher than the melting point to form a melt, thereafter a seed crystal is dipped into the melt and then the seed crystal is pulled upwardly from it. Crucibles used in the Czochralski method are made of high-purity quartz glass or the like, and they are shipped to customers from crucible makers after cleaning and drying in respective final processes. The crucibles each are delivered in a plastic bag in a sealed manner in order to avoid contamination during transportation.

When a crucible delivered is actually used at a customer, it is again cleaned with pure water (deionized water which has usually a resistivity of 10M Ω cm or higher) before the use in pulling a crystal for the purpose to remove contamination produced by friction with a plastic bag or contamination caused by poor sealing during transportation.

Cleaning before the use is very important for a high-purity quartz glass crucible used in pulling a silicon single crystal. The reason why is that a high-purity quartz glass crucible has a shiny, smooth inner surface, with which raw material contacts in the use, but the outer surface is a rough surface and quartz powder is with ease detached from the outer surface through friction between the crucible and the plastic bag during transportation though quartz raw material powder has been firmly adhered on the crucible. The detached quartz powder has a chance to stray onto the inner surface of the crucible and to adhere there. When a single crystal is pulled from a melt which is formed in such a contaminated crucible by heating silicon raw material charged in the crucible, a growing crystal comes to have dislocations caused by unmelted such detached quartz powder and to be disturbed in crystal growth. Accordingly, cleaning of a crucible before the use has been especially important for a crucible in pulling a silicon single crystal.

In such circumstances, a crucible has been again cleaned with pure water before the use at a site of the use after transportation, and then dried in order to remove adhered water on the surface by a dryer (for example, a dust free clean oven). A drying process with such a dryer is carried out in the following way: A crucible is placed in the dryer, a high-temperature air flow is circulated in the dryer, while wet air flow is partly exhausted to the outside through an exhaust duct. As alternatives, there are methods such as to blow a warm air flow on a crucible and to dry it by a infrared (IR) lamp.

When a crystal is pulled with a crucible which has not been dried enough, it takes a long time for gas replacement with an inert gas through vacuum in the pulling furnace, which reduces a working efficiency. Foreign matter is attached to a surface holding water with ease. Accordingly, it is necessary to dry the crucible enough.

In the case where crucibles are dried with a dryer after re-cleaning the crucibles before the use in a conventional manner, however, such drying and related processes need large-sized facilities. Such facilities cause a big loss in energy and require precaution on heat resistance of parts of their own, and, therefore, as a whole, cannot have been said to have an economically good efficiency. Even when warm air flow is adopted for the drying, there is a requirement for installation of a fan and the like, so that such drying needs a large-scaled facilities, too, and still loses a lot of energy. Furthermore, heating and drying by an infrared lamp cannot have been said to be an efficient, good drying method either, because of requirements for consideration on heat resistance of facilities and rotation of crucibles to achieve uniform heat distribution of a heating environment.

SUMMARY OF THE INVENTION

Accordingly, it is an object of the present invention to provide a cleaning method of a crucible, wherein a crucible after transportation can be cleaned and dried before the use in simplified facilities.

The inventors have completed the present invention in a serious research which has been conducted in various ways to solve the above described problems and it was based on a method discovered in the course of the research which enables a crucible to be dried efficiently in its clean state without the need for large-scaled facilities such as a dryer and the like.

The first aspect of the present invention is directed to a cleaning method of a crucible used to contain a raw material melt in pulling a semiconductor single crystal by a Czochralski method comprising the steps of: cleaning a crucible in a cleaning process; then warming the crucible with pure water heated at a temperature 50° C. or higher (hereinafter referred to as warm pure water); and drying the warmed crucible in natural conditions.

The second aspect of the present invention is directed to a cleaning method of a crucible as recited in the first aspect, wherein the warming step by warm pure water is performed by pouring warm pure water on an inner and outer surfaces of the crucible in a shower.

The third aspect of the present invention is directed to a cleaning method of a crucible as recited in the first aspect, wherein the warming step by warm pure water is performed by dipping the crucible in a warm pure water bath.

The fourth aspect of the present invention is directed to a cleaning method of a crucible as recited in any of the first to third aspects, wherein the additional step of causing a clean gas to blow on the crucible to remove water on the surface before the drying step.

The following are a detailed description of the above aspects of the present invention. According to the present invention, in the last stage of cleaning a crucible, the crucible is showered with warm pure water on both of the inner and outer surfaces of the crucible or dipped in a warm water bath, and after the crucible is warmed to a temperature same as that of warm pure water, it is left in an area filled with dust free air (Such area is generally called a clean tunnel and the dust free air is of an air cleanliness of class 100 after being filtered through a HEPA filter.) and the crucible can be dried to the same state as when it is dried with a dryer in a short time.

Besides, more efficient drying can be achieved by causing clean gas to blow, which has been filtered by a filter such as clean air, high-purity nitrogen or high-purity argon, onto both of the inner and outer surfaces of the crucible to remove water to accelerate the drying, after warming up the crucible with warm pure water.

BRIEF DESCRIPTION OF THE DRAWINGS

The novel features which are considered characteristic of the present invention are set forth with particularity in the appended claims. The present invention itself, however, and additional objects and advantages thereof will best be understood from the following description of embodiments thereof when read in connection with the accompanying drawings, in which:

FIG. 3 is a graph showing changes in absolute humidity over a time in a plastic bag containing a crucible; and FIG. 4 is a graph showing changes in water content present in a plastic bag containing a crucible.

DETAILED DESCRIPTION OF THE INVENTION

Below, description will be in detail given about examples embodying the present invention in reference to accompanying drawings.

Figure 1:
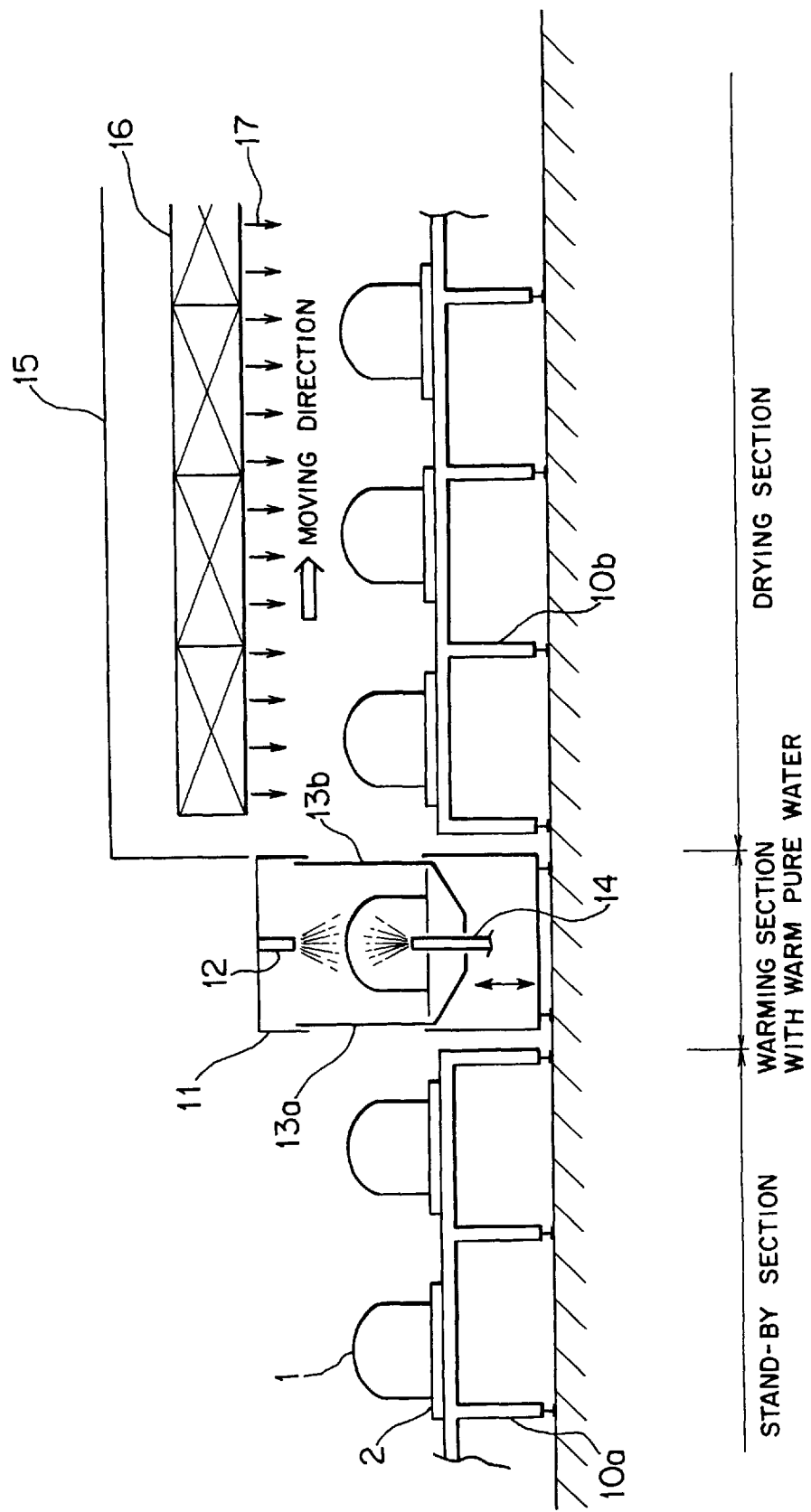
FIG. 1 is a diagram illustrating a system embodying a cleaning method according to the present invention, which structure comprises a cleaning machine and a clean tunnel operated on-line with each other.

FIG. 1 is a diagram showing a system comprising a line of an automatic cleaning and drying section which is used for embodying a cleaning method of the present invention, wherein a warming unit for warm pure water (a cleaning machine) and a clean tunnel are operated on-line with each other. In this system, a crucible 1 which has been passed through a preceding cleaning process, i.e. cleaning by pure water, is transported by an automatic conveyer 10a on the entrance side to the warming unit 11 for warm pure water. The crucible 1 is transferred into the warming unit 11 after a door 13a on the entrance side of the warming unit 11 is opened. After the door 13a is closed, the warm pure water is caused to flow through an upper nozzle 12 and a lower nozzle 14, which is moved up before to use, and to pour on the crucible in a shower. The warm pure water is kept pouring until the crucible 1 is warmed up to a temperature (50° C. or higher) equal to a temperature of the warm pure water. A door 13b on the exit side is opened after warming up the crucible 1 and the crucible 1 is transported by an automatic conveyer 10b on the exit side through the inside of the clean tunnel 15. While the crucible 1 is under transportation in the tunnel 15, clean air 17 is caused to jet down on the surfaces of the crucible 1 to remove water thereon. The crucible 1 is left to dry naturally in the inside of the clean tunnel 15 after removal of the water on the crucible.

In another embodiment, the crucible 1 may be dipped in a warm pure water bath instead of showering the crucible 1 with the warm pure water on both of the inner and outer surfaces.

The following examples were conducted for comparison between a method of the present invention in examples and another method in comparative examples, wherein quartz crucibles 22 inches (559 mm) in diameter and of about 17 kg were used for the examples and comparative examples.

EXAMPLE 1

After a normal cleaning process, a quartz crucible 1 was showered with pure water of 25° C. at a feed rate of 13 l/min. for 3 min., subsequently with warm pure water of 85° C. at the same feed rate of 13 l/min. for 2 min., and clean air was caused to blow onto the crucible 1 at a feed rate of 160 l/min. for 2 min. to remove water thereon. After removal of the water, the crucible was left in the clean tunnel 15 for 30 min.

EXAMPLE 2

After a normal cleaning process, a quartz crucible 1 was showered with pure water of 25° C. at a feed rate of 13 l/min. for 3 min., subsequently with warm pure water of 85° C. at the same feed rate of 13 l/min. for 3 min., and clean air was caused to blow onto the crucible 1 at a feed rate of 160 l/min. for 2 min. to remove water thereon. After removal of the water, the crucible was left in the clean tunnel 15 for 30 min.

EXAMPLE 3

After a normal cleaning process, a quartz crucible 1 was showered with pure water of 25° C. at a feed rate of 13 l/min. for 3 min., subsequently with warm pure water of 85° C. at the same feed rate of 13 l/min. for 4 min., and clean air was caused to blow onto the crucible 1 at a feed rate of 160 l/min. for 2 min. to remove water thereon. After removal of the water, the crucible was left in the clean tunnel 15 for 30 min.

COMPARATIVE EXAMPLE 1

After a normal cleaning process, a quartz crucible 1 was cleaned with pure water. The crucible 1 was then dried in a constant-temperature chamber having a nitrogen atmosphere therein.

COMPARATIVE EXAMPLE 2

After a normal cleaning process, a quartz crucible 1 was showered with pure water of 25° C. at a feed rate of 13 l/min. for 3 min. Clean air was then caused to blow onto the crucible 1 at a feed rate of 160 l/min. for 2 min. to remove water thereon and after removal of the water the crucible was left in the clean tunnel for 30 min.

Figure 2:
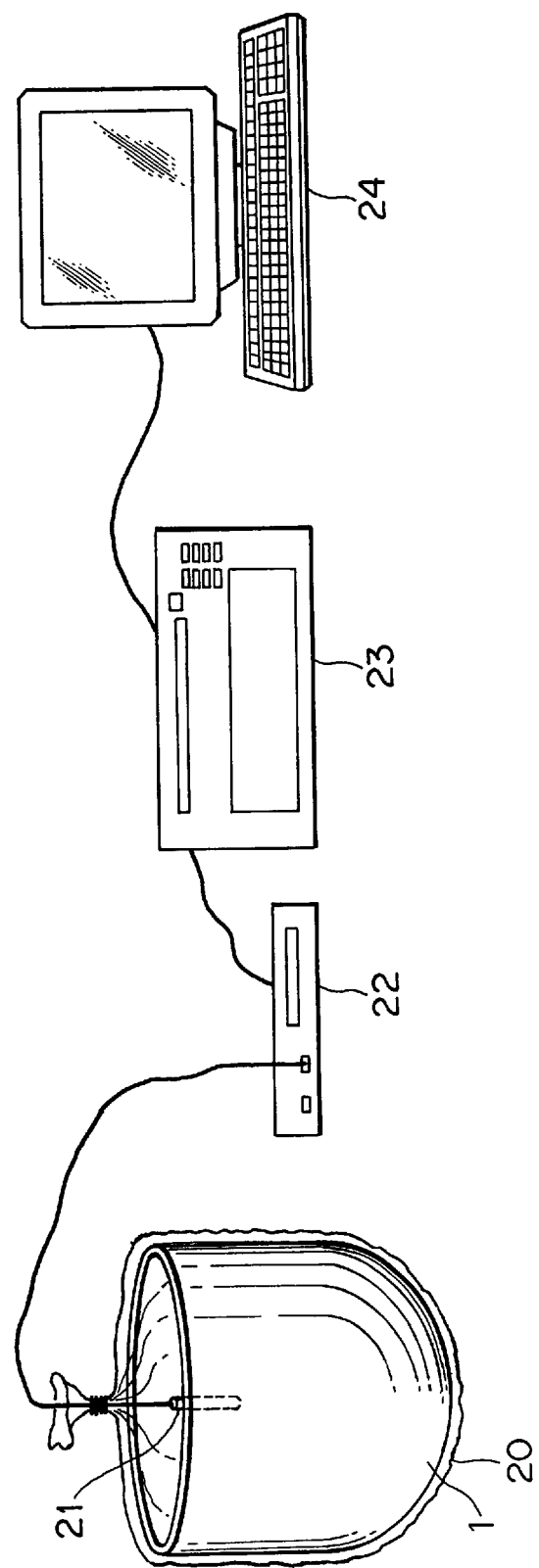
FIG. 2 is a representation of the measurement system for a dryness of a crucible.

A dryness was measured on each of crucibles respectively dried in the examples or comparative examples by a measuring system for a dryness of a crucible shown in FIG. 2. The measurement was conducted by a series of the steps of: putting a crucible 1 into a double-layer plastic bag 20; putting a detecting element 21 for temperature and humidity into the same plastic bag 20; sealing airtight the opening of the plastic bag 20 with a plastic string; detecting a temperature and humidity in the plastic bag 20 by way of the detecting element 21; storing changes in temperature and humidity over a time in the inside of the plastic bag 20 in a hybrid recorder 23 to keep a record; and analyzing the record with a personal computer 24 to depict changes in absolute humidity and water content in the inside of the plastic bag 20 over a time on a graph. When a crucible is dry enough, absolute humidities and water contents in the plastic bag 20 respectively show constant values of zero over a time, whereas, when a crucible is not dry enough, absolute humidities and water contents were both increased as time passed.

FIGS. 3 and 4 show changes in absolute humidity and water content in the inside of each of the plastic bags 20 as time passed, the plastic bags 20 respectively containing crucibles dried in various ways employed in the examples and comparative examples. As can be seen from the figures, according to the drying methods of the examples 1 to 3, a dryness of each crucible in the examples was measured at the same level as that of the comparative example 1 using a conventional dryer, but in the case of the comparative example 2 where neither a dryer nor warm pure water was used, a dryness at a satisfactory level was not achieved.

As described in the above, according to a method of the present invention, crucibles can be dried in simplified facilities. More particularly speaking, the use of the method lowers the cost for the facilities and receives a high appraisal in usefulness in the industry, since automation of the facilities is easy.

We claim:

1. A method of cleaning and drying a crucible for containing a raw material melt for pulling a semiconductor single crystal by a Czochralski method, comprising the steps of:

cleaning a crucible by a cleaning process using pure water;

subsequently warming the cleaned crucible with warm pure water heated to a temperature of at least about 50° C.; and drying the warmed crucible by exposing the warmed crucible to clean air at ambient temperature.

2. A method of cleaning and drying a crucible as claimed in claim 1, wherein the warming of the crucible by warm pure water comprises pouring warm pure water on inner and outer surfaces of the crucible in a shower.

3. A method of cleaning and drying a crucible as claimed in claim 2, further comprising the step of blowing a clean gas onto the crucible to remove water from the crucible before the step of drying.

4. A method of cleaning and drying a crucible as claimed in claim 1, wherein the warming of the crucible by warm pure water comprises dipping the crucible in a warm pure water bath.

5. A method of cleaning and drying a crucible as claimed in claim 4, further comprising the step of blowing a clean gas onto the crucible to remove water from the crucible before the step of drying.

6. A method of cleaning and drying a crucible as claimed in claim 1, further comprising the step of blowing a clean gas onto the crucible to remove water from the crucible before the step of drying.

7. A method of cleaning and drying a crucible for containing a raw material melt for pulling a semiconductor single crystal by the Czochralski method, comprising:

cleaning a crucible using warm pure water heated to a temperature of at least about 50° C.; and drying the cleaned crucible in clean air at ambient temperature.

8. A method of cleaning and drying a crucible as claimed in claim 7, further comprising blowing a clean gas onto the crucible to remove water from the crucible before drying.

9. A method of preparing a crucible to contain a raw material melt for pulling a semiconductor single crystal by the Czochralski method, comprising:

prior to utilizing a crucible to contain a raw material melt, cleaning the crucible using warm pure water heated to a temperature of at least about 50° C.; and drying the cleaned crucible in clean air at ambient temperature.

10. A method of preparing a crucible as claimed in claim 9, further comprising blowing a clean gas onto the crucible to remove water from the crucible before drying.

* * * * *